United States Patent
Han et al.

(10) Patent No.: US 9,728,540 B2
(45) Date of Patent: Aug. 8, 2017

(54) SEMICONDUCTOR DEVICE FOR REDUCING COUPLING CAPACITANCE

(71) Applicant: SK hynix Inc., Icheon (KR)

(72) Inventors: Ky Hyun Han, Icheon (KR); Chang Heon Park, Seoul (KR); Dong Gu Choi, Seongnam (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/208,348

(22) Filed: Jul. 12, 2016

(65) Prior Publication Data

US 2016/0322364 A1    Nov. 3, 2016

Related U.S. Application Data

(62) Division of application No. 14/473,139, filed on Aug. 29, 2014, now Pat. No. 9,419,002.

(30) Foreign Application Priority Data

Feb. 14, 2014 (KR) .......................... 10-2014-0017325

(51) Int. Cl.
| | |
|---|---|
| H01L 27/108 | (2006.01) |
| H01L 21/768 | (2006.01) |
| H01L 27/11 | (2006.01) |
| H01L 21/02 | (2006.01) |
| H01L 21/311 | (2006.01) |
| H01L 23/522 | (2006.01) |
| H01L 23/528 | (2006.01) |
| H01L 23/532 | (2006.01) |

(52) U.S. Cl.
CPC .... *H01L 27/10885* (2013.01); *H01L 21/0223* (2013.01); *H01L 21/31144* (2013.01); *H01L 21/76802* (2013.01); *H01L 21/76835* (2013.01); *H01L 23/528* (2013.01); *H01L 23/5226* (2013.01); *H01L 23/53295* (2013.01); *H01L 27/10814* (2013.01); *H01L 27/10855* (2013.01); *H01L 27/10888* (2013.01); *H01L 27/11* (2013.01)

(58) Field of Classification Search
CPC .................. H01L 23/5329; H01L 23/5226
See application file for complete search history.

(56) References Cited

U.S. PATENT DOCUMENTS

| | | | |
|---|---|---|---|
| 2012/0112339 A1 | 5/2012 | Park | |
| 2012/0276711 A1 | 11/2012 | Yoon et al. | |
| 2013/0161781 A1* | 6/2013 | Lee | H01L 27/10855 257/499 |

FOREIGN PATENT DOCUMENTS

| | | |
|---|---|---|
| KR | 10-2011-0112127 A | 10/2011 |
| KR | 10-1177999 B1 | 8/2012 |
| KR | 10-2012-0121795 A | 11/2012 |

* cited by examiner

*Primary Examiner* — Dung Le

(57) ABSTRACT

A semiconductor device includes a spacer having a nitride/oxide/nitride (NON) structure. The spacer is disposed between a sidewall of a bit line and a bit line contact and a sidewall of a storage node contact plug to reduce coupling capacitance between the bit line and a storage node contact plug and between the bit line contact and the storage node contact plug.

10 Claims, 10 Drawing Sheets

SEMICONDUCTOR DEVICE FOR REDUCING COUPLING CAPACITANCE

CROSS-REFERENCES TO RELATED APPLICATION

The present application is a divisional of U.S. patent application Ser. No. 14/473,139, filed on Aug. 29, 2014, which claims priority to Korean patent application number 10-2014-0017325, filed on Feb. 14, 2014, which is incorporated by reference herein in its entirety.

BACKGROUND OF THE INVENTION

1. Technical Field

Embodiments relate to a semiconductor device and a manufacturing method thereof, and more particularly, to a semiconductor device capable of reducing coupling capacitance between a bit line and a storage contact plug and between a bit line contact and the storage contact plug, and a manufacturing method thereof.

2. Related Art

Semiconductor devices are manufactured using various processes, for example, ion implantation, thin film deposition, or the like. The semiconductor devices include elements such as transistors, capacitors, and resistors and these elements are coupled through conductive layers to transmit and/or receive data or signals.

As manufacturing technology for semiconductor devices has developed, the minimum feature size of structures in the semiconductor devices is reduced to improve the degree of integration.

In a semiconductor device in which a size of a unit cell is $6F^2$ (F: minimum feature size), an active region has an elliptic shape in which a major axis of the active region is tilted at an angle with respect to a direction along which a bit line extends. The semiconductor device includes a word line that has a gate structure, which is buried in a semiconductor substrate.

In the semiconductor device of a $6F^2$ structure, a bit line contact is connected to an active region, which is formed between neighboring buried gates, and a bit line is stacked on the bit line contact to be connected to the bit line contact. Storage node contacts are connected to both end portions of the active region.

However, as a highly integrated semiconductor device is developed, the size of a unit cell of the semiconductor device is reduced, and thus a distance between the bit line and the storage node contact plug and a distance between the bit line contact and the storage node contact plug is reduced.

Therefore, coupling capacitance between the bit line and the storage node contact plug and between the bit line contact and the storage node plug is increased in a highly integrated semiconductor device.

SUMMARY

Various embodiments are directed to providing a semiconductor device and a method of manufacturing the semiconductor device, which may reduce coupling capacitance between a bit line and a storage contact plug and between a bit line contact and the storage contact plug in a semiconductor device.

According to an embodiment, a semiconductor device may include a bit line contact, a bit line located on the bit line contact to be connected to the bit line contact, and a spacer located on sidewalls of the bit line contact and the bit line. The spacer may have a structure in which a first spacer, a second spacer having a dielectric constant different from the first spacer, and a third spacer having a dielectric constant different from the second spacer are stacked.

According to an embodiment, a semiconductor device may include a bit line contact located on a first active region to be connected to the first active region, a bit line located on the bit line contact to be connected to the bit line contact, a storage node contact located on a second active region adjacent to the first active region to be connected to the second active region, and an insulating layer located between the bit line contact and the storage node contact. The insulating layer may have a structure in which a first insulating layer, a second insulating layer having a dielectric constant different from the first spacer, and a third insulating layer having a dielectric constant different from the second spacer are stacked.

According to an embodiment, a method of manufacturing a semiconductor device include forming a bit line contact on an active region, forming a bit line on the bit line contact, and forming a spacer, in which insulating layers having dielectric constants different from each other are stacked, on sidewalls of the bit line contact and the bit line These embodiments may reduce coupling capacitance between a bit line and a storage node contact plug and between a bit line contact and the storage node contact plug in a semiconductor device, which has a buried gate.

These and other features, aspects, and embodiments are described below in the section entitled "DETAILED DESCRIPTION".

BRIEF DESCRIPTION OF THE DRAWINGS

The above and other aspects and features of the present disclosure will be more clearly understood from the following detailed description taken in conjunction with the accompanying drawings, in which.

DETAILED DESCRIPTION

Figure 1:
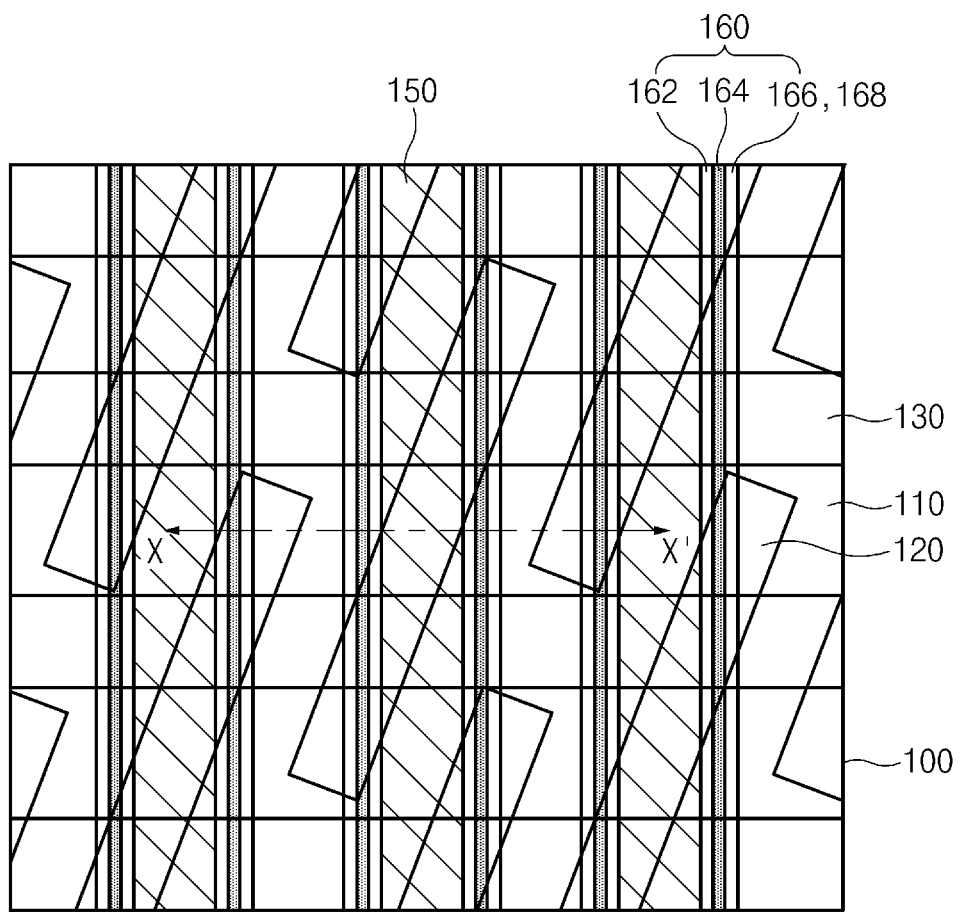
FIG. 1 is a plan view illustrating a cell array structure of a semiconductor device according to an embodiment.

Hereinafter, embodiments will be described in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a plan view illustrating a cell array structure of a semiconductor device according to an embodiment. FIG.

2 is a cross-sectional view illustrating the semiconductor device taken along line X-X' of FIG. 1.

Active regions 120, which are defined by a device isolation layer 110, are formed in a semiconductor substrate 100. Each active region 120 crosses two neighboring gates 130 which divide the active region 120 into three regions. That is, the active region 120 is divided into a bit line contact region between the neighboring gates 130, and storage node contact regions located outside the gates 130, respectively. The gate 130 may be a buried gate in which the gate 130 is buried in the active region 120 and the device isolation layer 110. An insulating layer (e.g., a sealing layer) may be formed on the buried gate 130 to electrically isolate the gate 130. Junction regions into which impurities are implanted may be formed in the bit line contact region and the storage node contact regions of the active region 120.

Figure 2:
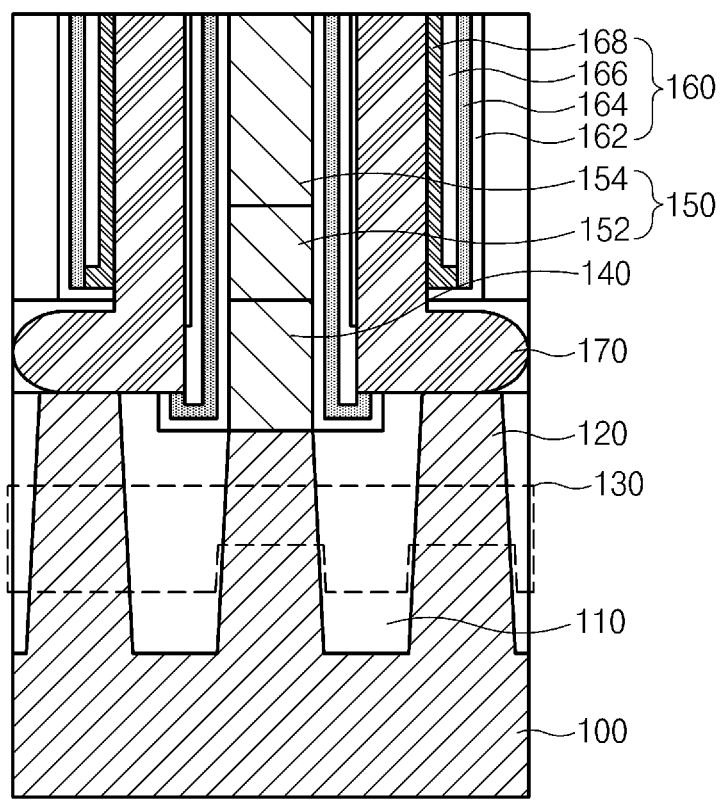
FIG. 2 is a cross-sectional view illustrating the semiconductor device taken along line X-X' of FIG. 1.

Referring to FIG. 2, a bit line contact 140 is formed on the bit line contact region in the active region. A bit line 150 is formed on the bit line contact 140 such that the bit line 150 crosses the buried gate 130. In an embodiment, the bit line 150 includes a conductive layer 152 and a hard mask layer 154. The bit line 150 is formed as a line type and extends in a direction tilted at an oblique angle with respect to a major axis of the active region 120. In an embodiment, the bit line contact 140 is patterned simultaneously with the bit line 150. In this embodiment, the bit line contact 140 may have substantially the same width as that of the bit line 150.

Spacers 160 are formed on both sidewalls of the bit line 150 and the bit line contact 140. The spacer 160 may have a nitride-oxide-nitride (NON) structure in which a nitride layer 162, an oxide layer 164, and nitride layers 166 and 168, each of which may have different dielectric constants, are sequentially stacked. In this embodiment, the spacer 160 including the NON structure is formed between a sidewall of the bit line 150 and a sidewall of a storage node contact 170, and between a sidewall of the bit line contact 140 and a sidewall of a storage node contact plug 170. Therefore, coupling capacitance between the bit line contact 140 and the storage node contact plug 170 may be reduced, compared to a conventional structure in which a spacer between the sidewall of the bit line contact 140 and the sidewall of the storage node contact plug 170 has a single insulating layer.

FIGS. 3 to 10 are cross-sectional views illustrating processes of manufacturing a semiconductor device having the structure of FIG. 2 according to an embodiment.

Figure 3:
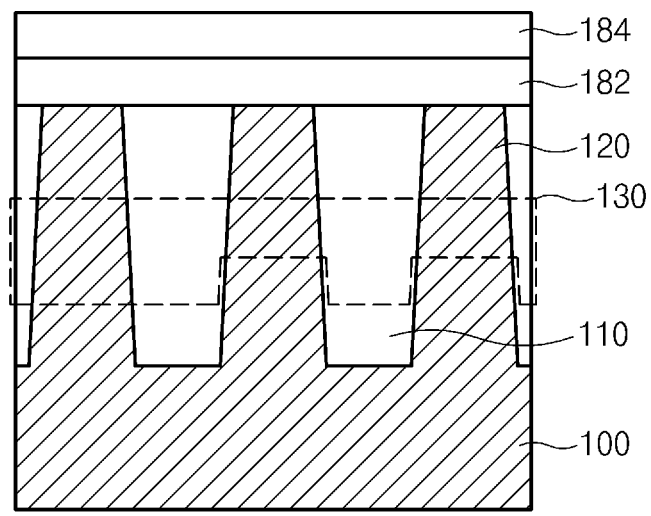
FIGS. 3 to 10 are cross-sectional views illustrating processes of manufacturing a semiconductor device according to an embodiment.

Referring to FIG. 3, a device isolation layer 110, which defines active regions 120, is formed in a semiconductor substrate 100 using a shallow trench isolation (STI) process.

In an embodiment, a pad nitride layer (not shown) is formed on the semiconductor substrate 100, and a photoresist pattern (not shown) which defines a device isolation region is formed on the pad nitride layer. Next, the pad nitride layer and the semiconductor substrate 100 are etched using the photoresist pattern as an etch mask to form a device isolation trench (not shown). In an embodiment, a pad oxide layer may be formed between the semiconductor substrate 100 and the pad nitride layer to facilitate the formation of the device isolation trench. A wall oxidation layer (not shown) and a liner nitride layer (not shown) are formed on an inner surface of the device isolation trench. Next, an insulating layer (not shown) is formed to be buried in the device isolation trench. The insulating layer may include any of a silicon on dielectric (SOD) material, a high-density plasma (HDP) oxide layer, and a combination thereof. The insulating layer is planarized through a chemical mechanical polishing (CMP) process until the active region 120 is exposed to form the device isolation layer 110.

A hard mask layer is deposited and patterned to form hard mask pattern 182. The device isolation layer 110 and the active region 120 are etched using hard mask pattern 182, which defines a gate region and a recess in which a gate will be formed. A gate insulating layer is formed on an inner surface of the recess, and a buried gate 130 is formed on the gate insulating layer, so that the buried gate 130 is buried in a lower portion of the recess. Since the buried gate 130 is not shown in a cross-section taken along line X-X' of FIG. 1, for convenience of description, the buried gate 130 is indicated by a dotted line in FIG. 3.

Subsequently, a sealing layer 184 is formed on the buried gate 130 and the hard mask pattern 182 and then planarized. In an embodiment, the sealing layer 184 includes a nitride layer. The hard mask pattern 182 and the sealing layer 184 are used for an interlayer insulating layer. Hereinafter, for convenience of description, the hard mask pattern 182 and the sealing layer 184 are referred to as an interlayer insulating layer 180.

Figure 4:
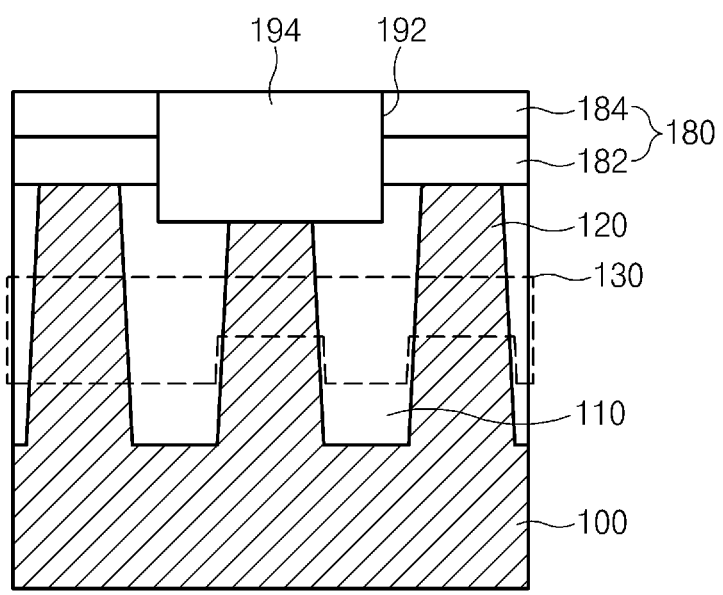

Referring to FIG. 4, a bit line contact mask (not shown) is formed on the interlayer insulating layer 180, and the interlayer insulating layer 180, the device isolation layer 110, and the active region 120 are etched using the bit line contact mask as an etch mask to form a bit line contact hole 192. In an embodiment, viewing FIG. 4 from top to bottom with respect to the orientation of the figure, the bit line contact hole 192 may have a substantially circular cross-section, and a diameter of the circular cross-section may be larger than a width of a bit line which is formed in a subsequent process.

Next, a conductive material (not shown) is formed to fill in the bit line contact hole 192, and then planarized until interlayer insulating layer 180 is exposed to form a contact pattern 194. In an embodiment, the contact pattern 194 includes polysilicon. In another embodiment, the contact pattern 194 has a multi-layer structure including a barrier metal layer (e.g., Ti, TiN) and a metal layer (e.g., W).

Figure 5:
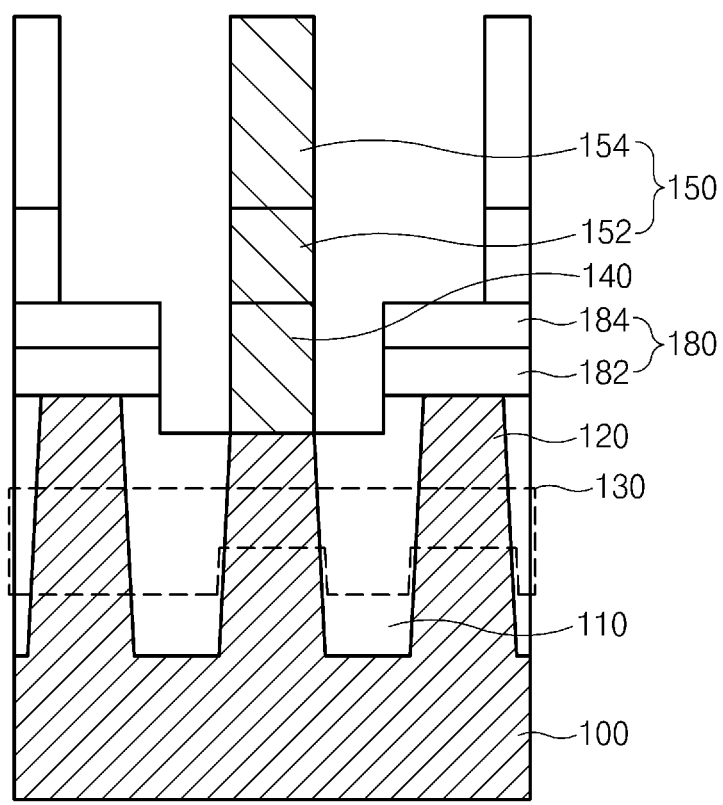

Referring to FIG. 5, a conductive layer (not shown) and a hard mask layer (not shown) are formed on the interlayer insulating layer 180 and the contact pattern 194. In an embodiment, the conductive layer may be formed as a multi-layer structure including a barrier metal layer (e.g., Ti, TiN) and a metal layer (e.g., W). Then, a bit line mask (not shown) is formed on the conductive layer.

Next, the hard mask layer, the conductive layer, and the contact pattern 194 are etched using the bit line mask as an etch mask to form a bit line contact 140 and a bit line 150. The bit line 150 has a multi-layer structure including the conductive layer 152 and the hard mask layer 154. Since the contact pattern 194 is etched to form the bit line contact 140 when the bit line 150 is patterned, the bit line contact 140 and the bit line 150 are formed using the same etching process. After the etching process is performed, the bit line mask is removed.

Figure 6:
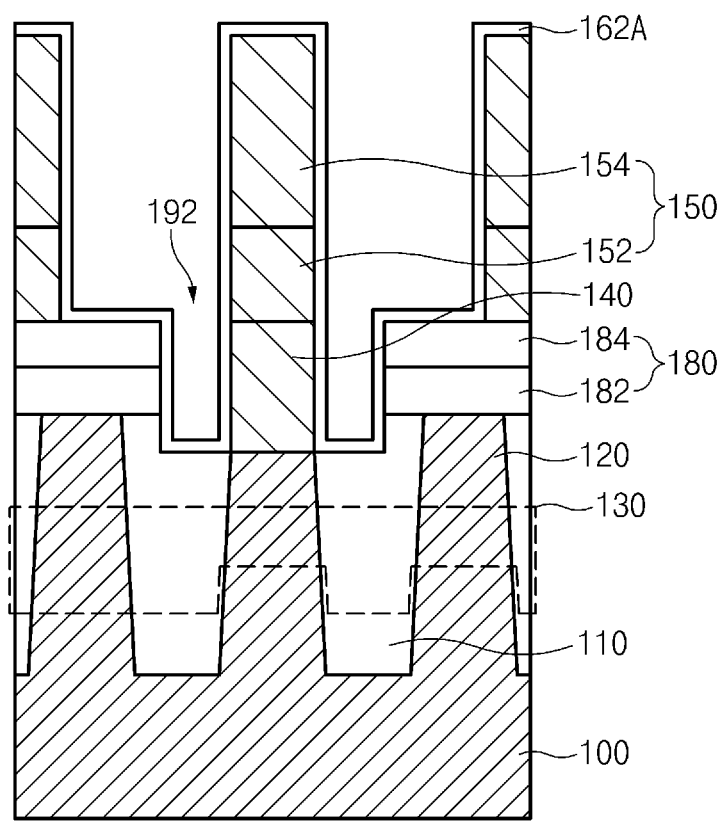

Referring to FIG. 6, a first spacer layer 162A is formed on sidewalls of the bit line contact 140 and the bit line 150. The first spacer layer 162A is also formed on an inner surface of the bit line contact hole 192 from which side portions of the contact layer 194 (see FIG. 4) has been removed.

The first spacer 162 may include a nitride layer, and be deposited to a thickness of about 20 to 50 Å.

Figure 7:
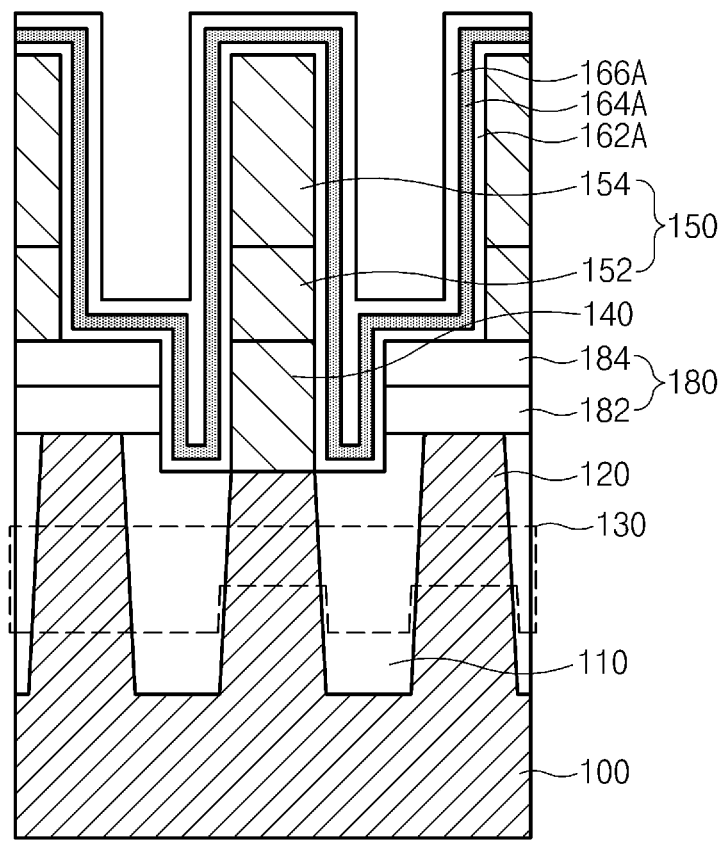

Referring to FIG. 7, a second spacer layer 164A is formed on the first spacer layer 162A. That is, the second spacer layer 164A is formed on exposed surfaces including sidewalls of the bit line contact 140 and the bit line 150. The second spacer 164 may include an oxide layer, and be deposited to a thickness in a range of about 30 to 60 Å.

The oxide layer 164A may be formed by transforming a portion of the first spacer layer 162A into an oxide layer. For example, the first spacer layer 162A may be formed to have a thickness in a range of about 50 to 110 Å, and a radical oxidation process is performed on the first spacer layer 162A. As a result, an upper portion of the first spacer layer 162A may be transformed into an oxide layer having a thickness in a range of about 30 to 60 Å which is second spacer layer 164A.

Subsequently, a third spacer layer 166A is formed on the second spacer layer 164A. A portion of the third spacer layer 166A is buried in the bit line contact hole 192 with portions of the first spacer layer 162A and the second spacer layer 164A, so that the buried portion of the third spacer layer 166A is formed on the sidewalls of the bit line contact 140 and fills remaining spaces in the bit line contact hole 192. In an embodiment, the third spacer layer 166A includes a nitride layer, and has a thickness in a range of about 40 to 80 Å.

Therefore, a spacer having a NON structure, in which the nitride first spacer layer 162A, the oxide second spacer layer 164A, and the nitride third spacer layer 166 are stacked, is formed on the sidewalls of the bit line contact 140 and the bit line 150.

Figure 8:
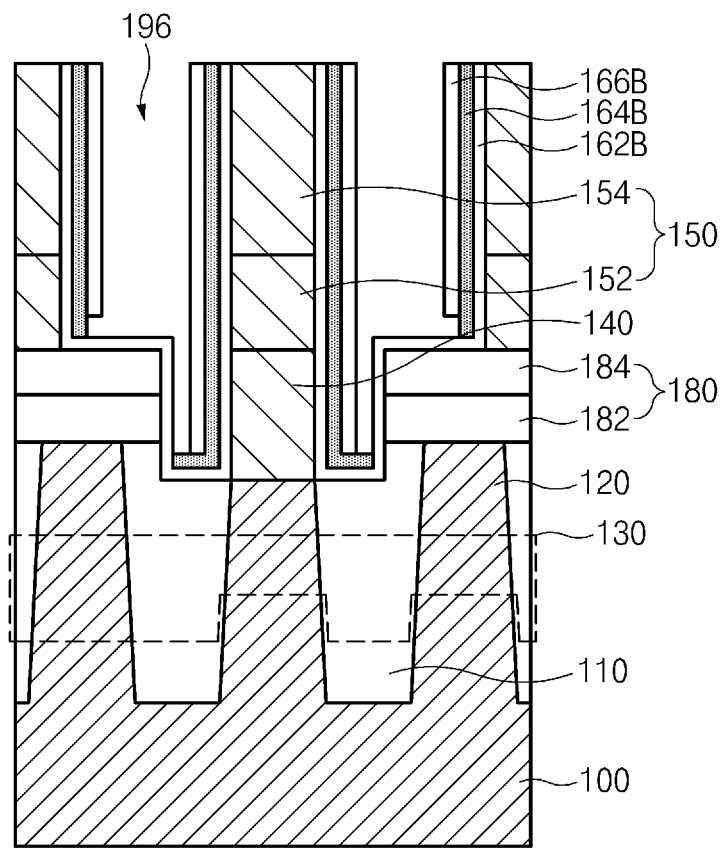

Referring to FIG. 8, portions of the third spacer layer 166A and the second spacer layer 164A proximate to a bottom portion of a trench 196 between bit lines 150 is selectively removed. In an embodiment, a portion of the third spacer layer 166A which is the bottom surface of the trench 196 is etched to expose a surface of the second spacer layer 164A. Then, an etch is performed to selectively remove of a portion of the second spacer layer 164A from a lower surface of trench 196. The resultant structure shown in FIG. 8 includes a first spacer pattern 162B, a second spacer pattern 164B, and a third spacer pattern 166B. In addition, portions of the first, second, and third spacer patterns 162A, 164B, and 166B are removed from top surfaces of bit line 150 in the same etch processes, or by a separate process such as a chemical mechanical polishing (CMP) process.

Figure 9:
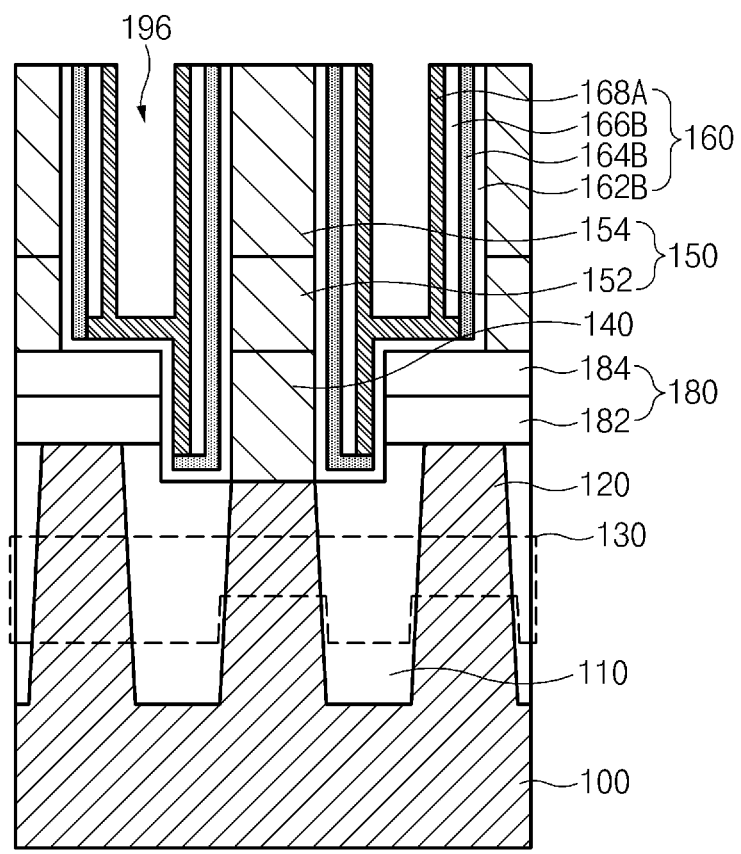

Referring to FIG. 9, a fourth spacer layer 168A is formed over an inner surface of a trench 196 to fill the portion from which the second spacer layer 164A and the third spacer layer 166A have been removed. That is, after a portion of the oxide layer 164A of FIG. 7 formed below the bottom surface of the recess 196 of FIG. 7 has been selectively removed, the nitride layer (or fourth spacer layer) 168A is formed in the removed portion of the oxide layer 164A. In an embodiment, the fourth spacer 168 includes a nitride layer, and has a thickness in a range of about 40 to 80 Å.

Replacing the removed portion of the oxide layer 164A with the nitride layer 168A may prevent a portion of the oxide pattern 164B formed on the sidewall of the bit line 150 and the bit line contact 140 from being removed in a subsequent storage node contact formation process. Since the nitride layer (or fourth space layer) 168A remains on a surface of the oxide pattern 164B in contact with the nitride layer 168A as shown in FIG. 9, the remaining nitride layer 168A substantially prevents the oxide pattern 164B from being exposed during the storage node contact formation process. As a result, the oxide pattern 164B is protected from a wet etching process to form the storage node contact plug 170 of FIG. 10. Accordingly, in an embodiment, nitride layer 168, which is formed to cover portions of the oxide pattern 164B, protects oxide pattern 164B from being etched during a wet etch process for forming storage node contact plug 170.

Although not shown, in an embodiment, the nitride layer 168A may be removed from a contacting surface of the oxide pattern 164B, so that a surface of the oxide pattern 164B in contact with the nitride layer 168A is exposed during the storage node contact formation process. In this embodiment, a portion of the oxide pattern 164B is etched during a wet etching process to form the storage node contact plug 170 of FIG. 10. However, process parameters (e.g., an etch time, a type of etchant) associated with the wet etching process may be adjusted such that a portion of the oxide pattern 164B between the sidewall of the bit line contact 140 and the sidewall of the storage node contact plug 170 remains substantially unetched. In such an embodiment, portions of the fourth layer 168A that remain over third layer 166B protect underlying second layer 164B from being removed when forming a contact hole. For example, if third layer 166B has a flaw that exposes oxide layer 164B to a wet etch process, fourth layer 168A may prevent a wet etch process from exacerbating the flaw and removing a portion of oxide layer 164.

Figure 10:
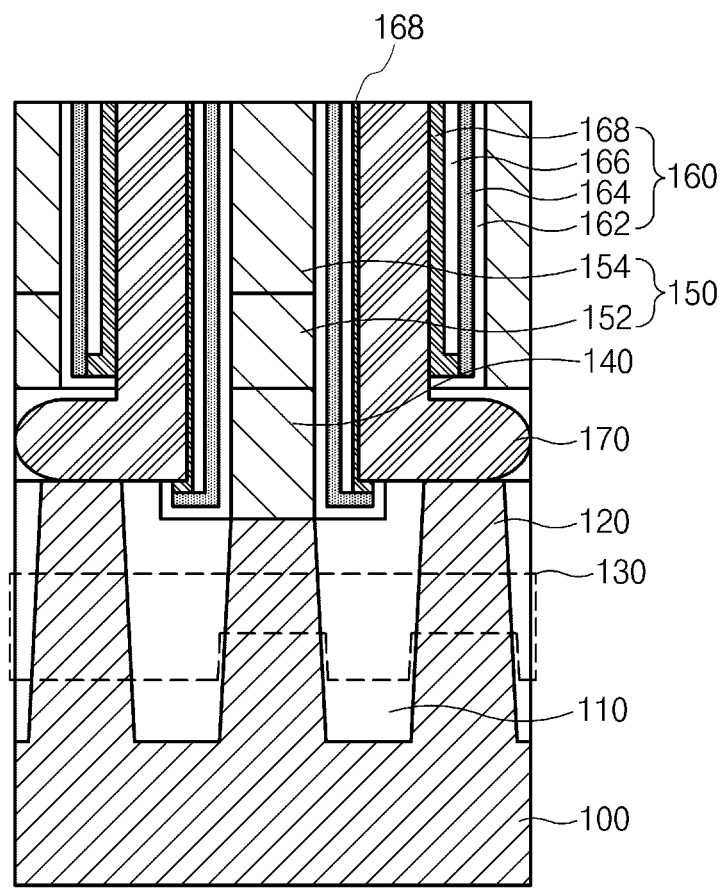

Referring to FIG. 10 corresponding to FIG. 2, an insulating layer (not shown) is formed to fill the trench 196. Then, the insulating layer, the spacer 160, and the interlayer insulating layer 180 are etched until a top surface of the active region 120 is exposed to form a storage node contact hole.

Subsequently, a conductive material is deposited to fill the storage node contact hole, and planarized to form a storage node contact plug 170.

A data storage unit (not shown) such as a capacitor is formed on the storage node contact plug 170. In the embodiment shown in FIG. 10, the storage node contact plug 170 has an offset or "L" shape. More specifically, a lower portion of the storage node contact plug 170 which is in contact with active region 120 extends laterally towards a neighboring bit line 150. An upper portion of the storage node contact plug 170 extends vertically in parallel to sidewalls of bit line 150, and is coupled to a storage node.

In an embodiment, the data storage unit is manufactured using conventional fabrication processes of the data storage unit. Implementation of the data storage unit may vary with a type of a semiconductor device. For example, when the above-described bit line contact structure is used in a dynamic random access memory (DRAM), the data storage unit includes a capacitor. When the above-described bit line contact structure is used in a ferroelectric RAM (FeRAM), the data storage unit includes a ferroelectric material. When the above-described bit line contact structure is used in a magneto-resistive RAM (MRAM), the data storage unit includes a magnetic tunnel junction (MTJ). When the above-described bit line contact structure is used in a phase-change RAM (PRAM) or a resistive RAM (ReRAM), the data storage unit includes a phase-change material.

The above embodiments of the present disclosure are illustrative and not limitative. Variations and modifications are possible. Embodiments are not limited by the fabrication methods described herein. Nor are embodiments limited to any specific type of semiconductor device. Other additions, subtractions, or modifications are obvious in view of the present disclosure and are intended to fall within the scope of the appended claims.

What is claimed is:

1. A semiconductor device comprising:
a bit line contact disposed on a first active region and electrically connected to the first active region;
a bit line disposed on the bit line contact and electrically connected to the bit line contact;
a storage node contact disposed on a second active region adjacent to the first active region and electrically connected to the second active region; and
an insulating layer disposed between the bit line contact and the storage node contact,
wherein the insulating layer has a structure in which a first insulating layer with a first dielectric constant, a second insulating layer having a second dielectric constant, a third insulating layer having a third dielectric constant, and a protecting layer having a fourth dielectric constant are stacked, the second dielectric constant being different from the first dielectric constant the third dielectric constant, and the fourth dielectric constant, the protecting layer capping a lower portion of the second insulating layer.

2. The semiconductor device of claim 1, wherein the first insulating layer includes a nitride layer.

3. The semiconductor device of claim 1, wherein the second insulating layer includes an oxide layer.

4. The semiconductor device of claim 2, wherein the oxide layer is formed by transforming a portion of the first insulating layer.

5. The semiconductor device of claim 1, wherein the third insulating layer has the same dielectric constant as that of the first insulating layer.

6. The semiconductor device of claim 1, wherein the first insulating layer is a first nitride layer, the second insulating layer is an oxide layer disposed over the first nitride layer, and the third insulating layer is a second nitride layer disposed over the oxide layer.

7. The semiconductor device of claim 1, wherein the storage node contact includes a lower portion that runs laterally between the second active region and a portion of the insulating layer disposed over a sidewall of the bit line, and an upper portion that extends in parallel to the sidewall of the bit line.

8. The semiconductor device of claim 1, wherein the protecting layer has the same dielectric constant as those of the first and third insulating layers.

9. The semiconductor device of claim 1, wherein the protecting layer is disposed directly on the lower portion of the second insulating layer.

10. A semiconductor device comprising:
a bit line contact disposed on a first active region and electrically connected to the first active region;
a bit line disposed on the bit line contact and electrically connected to the bit line contact;
a storage node contact disposed on a second active region adjacent to the first active region and electrically connected to the second active region; and
an insulating layer disposed between the bit line contact and the storage node contact,
wherein the insulating layer has a structure in which a first insulating layer with a first dielectric constant, a second insulating layer having a second dielectric constant, a third insulating layer having a third dielectric constant are stacked, the second dielectric constant being different from both of the first dielectric constant and the third dielectric constant, and
wherein the storage node contact includes a lower portion that runs laterally between the second active region and a portion of the insulating layer disposed over a sidewall of the bit line, and an upper portion that extends in parallel to the sidewall of the bit line.

* * * * *